United States Patent [19]

Nguyen

[11] Patent Number: 5,917,349
[45] Date of Patent: Jun. 29, 1999

[54] CURRENT MODE DRIVER USING N-TYPE TRANSISTORS

[75] Inventor: Thai M. Nguyen, San Jose, Calif.

[73] Assignee: Kabushiki Kaisha Toshiba, Kawasaki, Japan

[21] Appl. No.: 08/947,780

[22] Filed: Oct. 9, 1997

[51] Int. Cl.[6] .................................................. H03B 1/00
[52] U.S. Cl. ........................... 327/108; 327/66; 327/405; 327/478; 323/312; 323/315
[58] Field of Search .................... 323/312, 315; 327/53, 66, 403, 405, 478, 490, 108

[56] References Cited

U.S. PATENT DOCUMENTS

| | | |
|---|---|---|
| 4,237,426 | 12/1980 | Sueyoshi . |
| 4,600,893 | 7/1986 | Sugimoto . |
| 4,701,719 | 10/1987 | Magata . |
| 4,890,067 | 12/1989 | Lamb . |
| 4,920,321 | 4/1990 | Armstrong . |
| 4,996,498 | 2/1991 | Hanna . |
| 5,053,718 | 10/1991 | Graeme et al. . |
| 5,068,595 | 11/1991 | Kearney et al. . |
| 5,220,289 | 6/1993 | Kunitaka . |
| 5,241,227 | 8/1993 | Jung et al. ............................ 323/315 |
| 5,345,073 | 9/1994 | Chang et al. . |
| 5,374,897 | 12/1994 | Moraveji . |
| 5,488,321 | 1/1996 | Johnson ................................ 327/66 |
| 5,530,444 | 6/1996 | Tice et al. . |
| 5,739,678 | 4/1998 | Nagaraj ................................ 323/315 |

*Primary Examiner*—Timothy P. Callahan
*Assistant Examiner*—Jung Ho Kim
*Attorney, Agent, or Firm*—Limbach & Limbach LLP; Ronald L. Yin

[57] ABSTRACT

An improved current mode driver circuit uses N-type transistors in current mirrors to achieve higher speed operation at lower cost. A pair of matched low frequency P-type transistors provide a small amount of current to each side of the differential amplifier which comprise of only N-type transistors in a current mirror connection to amplify the current supplied thereto.

5 Claims, 4 Drawing Sheets

Key to

CURRENT MODE DRIVER USING N-TYPE TRANSISTORS

TECHNICAL FIELD

The present invention relates to a current mode driver circuit or a differential current amplifier circuit, which uses N-type transistors, preferably vertical type, and P type transistors, preferably lateral type, with a lower performance manufacturing processing method, to achieve a higher speed operation.

BACKGROUND OF THE INVENTION

Current mode output driver circuits or differential current amplifier circuits are well known in the art. They are preferred over voltage mode output driver circuits because the slew rate of the output signals can be easily controlled. In addition, they can directly drive a pulse transformer. Typical applications include use in ethernet transceivers.

In the past, to implement a current mode driver circuit to drive a 50 ohm resistor, with one terminal connected to ground, the driver circuits were comprised of either PMOS transistors or high frequency PNP transistors. One example of a prior art current mode driver circuit 10 is shown in FIG. 1.

In FIG. 1, the driver circuit 10 comprises two vertical type PNP transistors 18 and 20 for receiving the input signals 26 and 28 at the bases thereof, respectively. The collectors of the PNP transistors 18 and 20 are respectively supplied to two 50 ohm resistors 22 and 24 and connected to ground. The collectors of the two PNP transistors 18 and 20 supply the outputs 30 and 32 of the output mode driver circuit 10, respectively.

The emitters of the PNP transistors 18 and 20 are connected to a single PNP transistor 16, preferably also vertical type, at its collector. The emitter of the PNP transistor 16 is connected to a voltage source such as Vcc. The base of the PNP transistor 16 is connected to the base of a matched PNP transistor 12 also at its base. The emitter of the PNP transistor 12 is also connected to the same voltage source Vcc. The base and the collector of the PNP transistor 12 are connected together and are connected to a current source 14 which is connected to ground. The PNP transistors 12 and 16 act as a current mirror.

The foregoing description of the prior art current mode driver circuit 10 consisting of PNP transistors 12, 16, 18, and 20 could also be replaced by PMOS FET transistors.

The shortcoming of the current mode driver circuit 10 of the prior art is that the circuit is comprised of either PNP transistors or PMOS FETs. Because the current mode driver circuit 10 has to operate under fast switching conditions, the process to make the fast switching PNP transistors, such as vertical type, or PMOS FET transistors, having high current density, is costly.

SUMMARY OF THE INVENTION

In the present invention, a current mode driver circuit is comprised of two matched P-type transistor means. Each of the P-type transistor means has a first terminal, a second terminal, and a third terminal for controlling the current flowing between the first terminal and the second terminal. The first terminal of the first P-type transistor means and the first terminal of the second P-type transistor means are commonly connected to a first voltage source. A first and a second N-type transistor means are connected, respectively, to the second terminal of the first and second P-type transistor means. The first and second N-type transistor means each has a first terminal, a second terminal and a third terminal with the third terminal controlling the current flow between the first terminal and the second terminal. The third terminal of the first and second N-type transistor means receives the input signals. The first terminals of the first and second N-type transitions means are commonly connected to a bias source. The second terminal of the first and second N-type transistor means are connected to the second terminal of the first and second P-type transistor means, respectively. A first and a second current mirror comprises only of N-type transistor means, with each having an input terminal, a control terminal and an output terminal. The input terminal of the first and second current mirrors are connected to the second terminal of the first and second P-type transistor means, respectively. The control terminals of the first and second current mirrors are commonly connected to the first voltage source. The output terminals of the first and second current mirrors provide the output of the current mode driver circuit.

DETAILED DESCRIPTION OF THE DRAWINGS

Figure 2A:
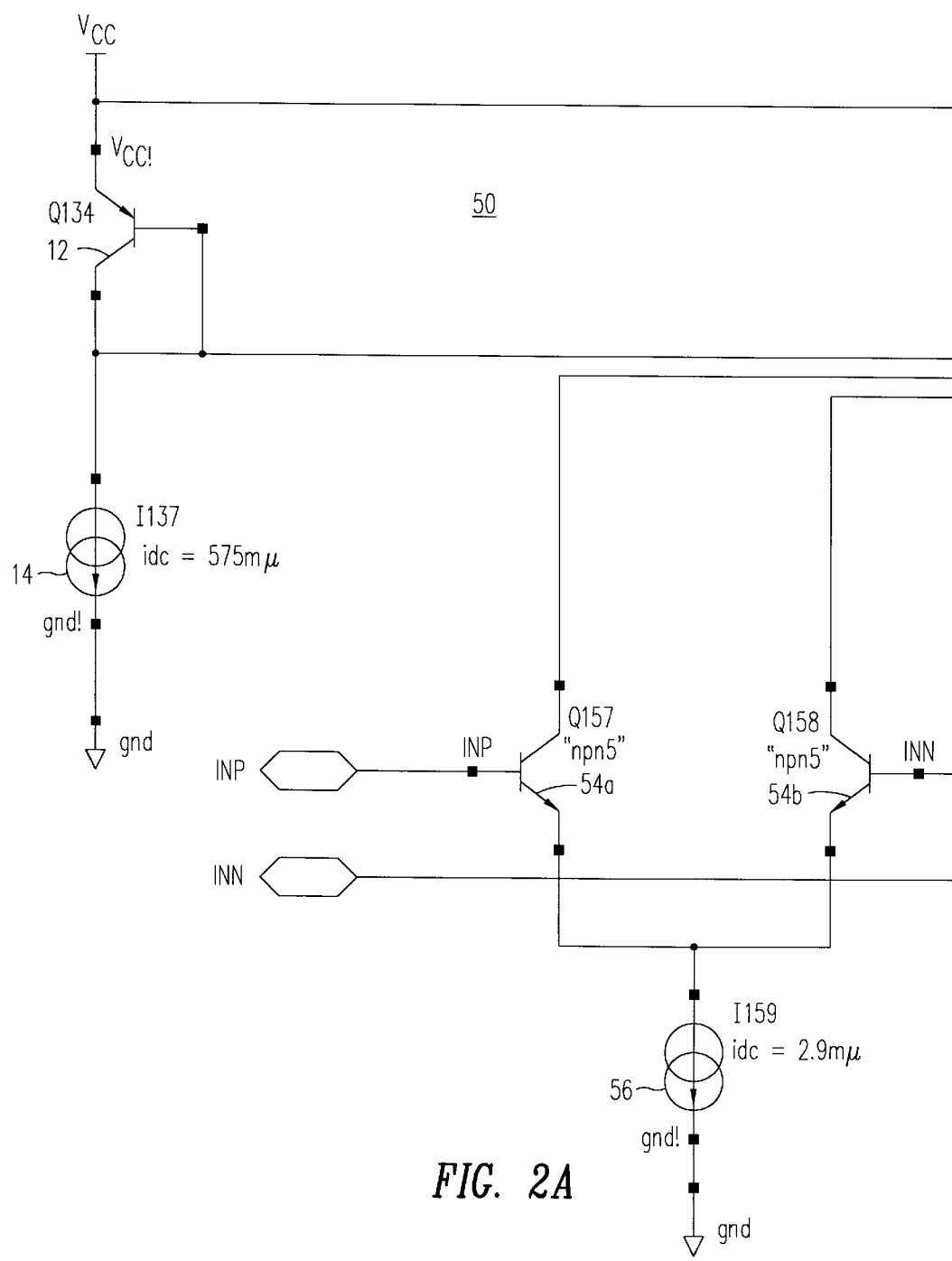
FIG. 2 is a schematic circuit diagram of the improved current mode driver circuit of the present invention.
Figure 2:
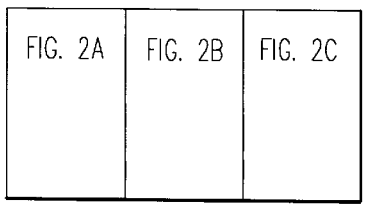
Figure 2B:
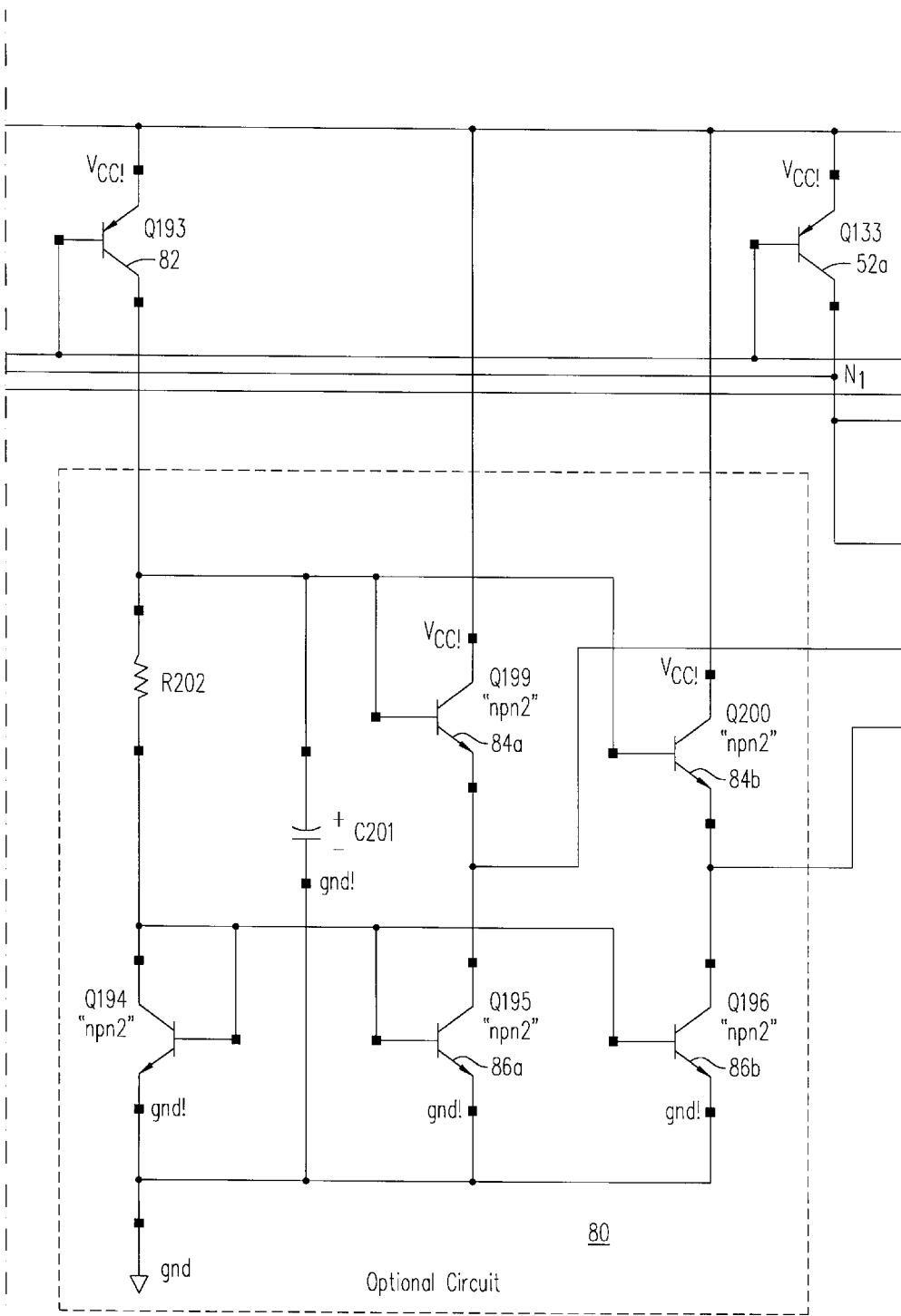
Figure 2C:
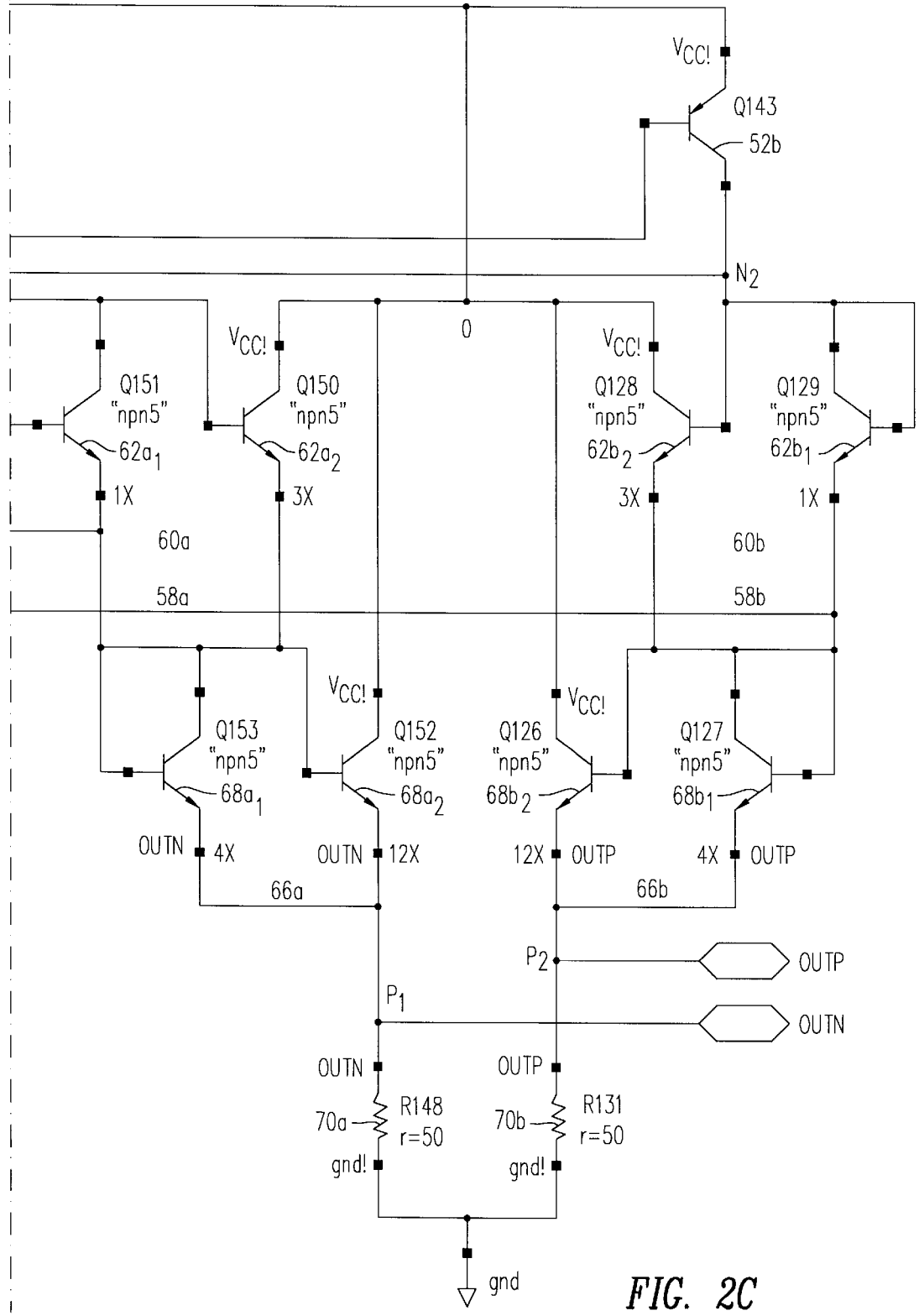

Referring to FIG. 2 there is shown a circuit diagram of a current mode driver circuit 50 of the present invention. Similar to the circuit 10 of the prior art, the circuit 50 comprises a first P-type transistor such as a PNP transistor 12 having an emitter connected to a voltage source such as Vcc. The base and collector of the PNP transistor 12 are connected together and are connected to a current source 14, which is connected to ground.

The driver circuit 50 also comprises two P-type transistor means 52a and 52b. Each of the PNP transistors 52a and 52b have emitters which are connected in common and to the voltage source Vcc. The bases of the PNP transistors 52a and 52b are connected together and to the base of the PNP transistor 12.

The collector of the PNP transistor 52a is connected to the collector of a N-type transistor, NPN transistor 54a. The collector of the other PNP transistor 52b is connected to the collector of an N-type transistor, NPN transistor 54b. The base of the NPN transistor 54b and the base of the NPN transistor 54a received the input signals. The emitters of the NPN transistors 54a and 54b are connected together and to a current source 56.

The collector of the PNP transistor 52a is also connected to a first current mirror 58a comprising of a plurality of serially connected current stages 60a and 66a. The current mirror 58a has an input terminal connected to the collector of the PNP transistor 52a at node $N_1$. The current mirror 58a has also a control terminal connected to node 0. Finally, the current mirror 58a has an output terminal connected to node $P_1$.

Similarly, a second current mirror 58b has an input terminal connected to the collector of the PNP transistor 52b at node $N_2$. The second current mirror 58b also has a control terminal connected to the common node 0. Finally, the second current mirror 58b has an output terminal connected to node $P_2$. The output nodes $P_1$ and $P_2$ of the first and second current mirrors 58a and 58b supply the output of the driver circuit 50. In addition, the output nodes $P_1$ and $P_2$ are connected to 50 ohm resistors 70a and 70b respectively which are connected to ground.

Each of the current mirrors 58a and 58b, as previously discussed, comprises a plurality of serially connected current stages 60 and 66. The current stage 60 comprises a pair of NPN transistors; $62a_1$ and $62a_2$. The NPN transistors $62a_1$ has its base and collector connected together to the input terminal at node $N_1$ and to the base of the NPN transistors $62a_2$. The collector of the NPN transistor $62a_2$ is connected to the control terminal 0. The emitters of NPN transistors $62a_1$ and $62a_2$ are connected together and form the output of the current stage 60a.

The output of the current stage 60a is supplied to the input of the current stage 68a. Thus, the emitters of the NPN transistors $62a_1$ and $62a_1$ are supplied to the base and collector of NPN transistor $68a_1$ and to the base of transistors $68a_2$, of the current stage 66a. The collector of the NPN transistor $68a_2$ is also connected to the control terminal at node 0. The emitters of the NPN transistors $68a_1$, and $68a_2$ are connected to the output terminal at node $P_1$.

Similarly, the current stage 60b comprises a pair of NPN transistors: $62b_1$ and $62b_2$. The base and collector of NPN transistor $62b_1$ is connected to the base of NPN transistor $62b_2$ and is connected to the input terminal at node $N_2$. The collector of the NPN transistor $62b_2$ is connected to the control terminal at node 0. The emitters of the NPN transistors $62b_1$ and $62b_2$ are connected together and form the output of the current stage 60b.

The output of the current stage 60b is supplied to the input of the current stage 66b, which comprises a pair of NPN transistors $68b_1$ and $68b_2$. The base and collector of transistors $68b_1$ are connected together to the output of the current stage 60b and are also connected to the base of the NPN transistor $68b_2$. The collector of the transistor 68b 2 is connected to the control terminal 0. The emitters of the NPN transistors $68b_1$ and $68b_2$ are connected together to node $P_2$ and form the output of the current stage 66b as well as the current mirror 58b.

The transistors $62a_1$ and $62a_2$ have similar characteristics. The only difference is that transistor $62a_2$ has three times the current capacity of transistor $62a_1$. Similarly, transistor $68a_2$ has three times the current capacity of transistor $60a_1$, but otherwise has the same characteristics. Similarly, in the current stage 60b, transistors $62b_2$ and $62b_1$ have the same characteristics except transistor $62b_2$ has three times the current carrying capacity of transistor $62b_1$. Finally, the NPN transistor $68b_2$ and $68b_1$ have similar characteristics except that the transistor $68b_2$ has three times the current carrying capability of transistor $68b_1$. The control terminal for the first and second current mirrors 58a and 58b at node 0 is connected to the voltage source Vcc.

In the operation of the current driver circuit 50, one of the PNP transistors 52a or 52b is on at all times. Depending on the input signal, one transistor 52 is on while the other is off, and vice versa. Assuming that the input signal turns on NPN transistor 54a, then current would flow through PNP transistor 52a through the NPN transistor 54a and through the current source 56. The inverse of the input signal would turn be off NPN transistor 54b. Current would then flow through the PNP transistor 52b into the current stage 60b and current stage 66b and to the output at node $P_2$. When current from the PNP transistor 52b flows into node $N_2$, the current is supplied through the NPN transistor $62b_1$. Because NPN transistor $62b_1$ and NPN transistor $62b_2$ are matched except for the current carrying capability and because these two transistors act as a current mirror, three times the amount of current would then flow from Vcc through node 0 and through NPN transistor $62b_2$. The output of the current stage 60b at the emitters of the NPN transistors $62b_1$ and $62b$ would be current which is four times the current from the PNP transistor 52b supplied to the NPN transistor $62b_1$. The current would then flow into NPN transistor $68b_1$. Again, since transistor $68b_2$ acts as a current mirror, three times the amount of current would flow through transistor $68b_2$ from node 0. Thus, at the output of the current stage 66b at node P2, 16 times the current would flow out compared to the current flowing in to node $N_2$ from the PNP transistor 52b.

Similarly, when the input signal is switched to a state such that NPN transistor 54b is on, and NPN transistor 54a is off, current would then flow through PNP transistor 52a, through current stage 60a and through current stage 66a to node $P_1$.

Figure 1:
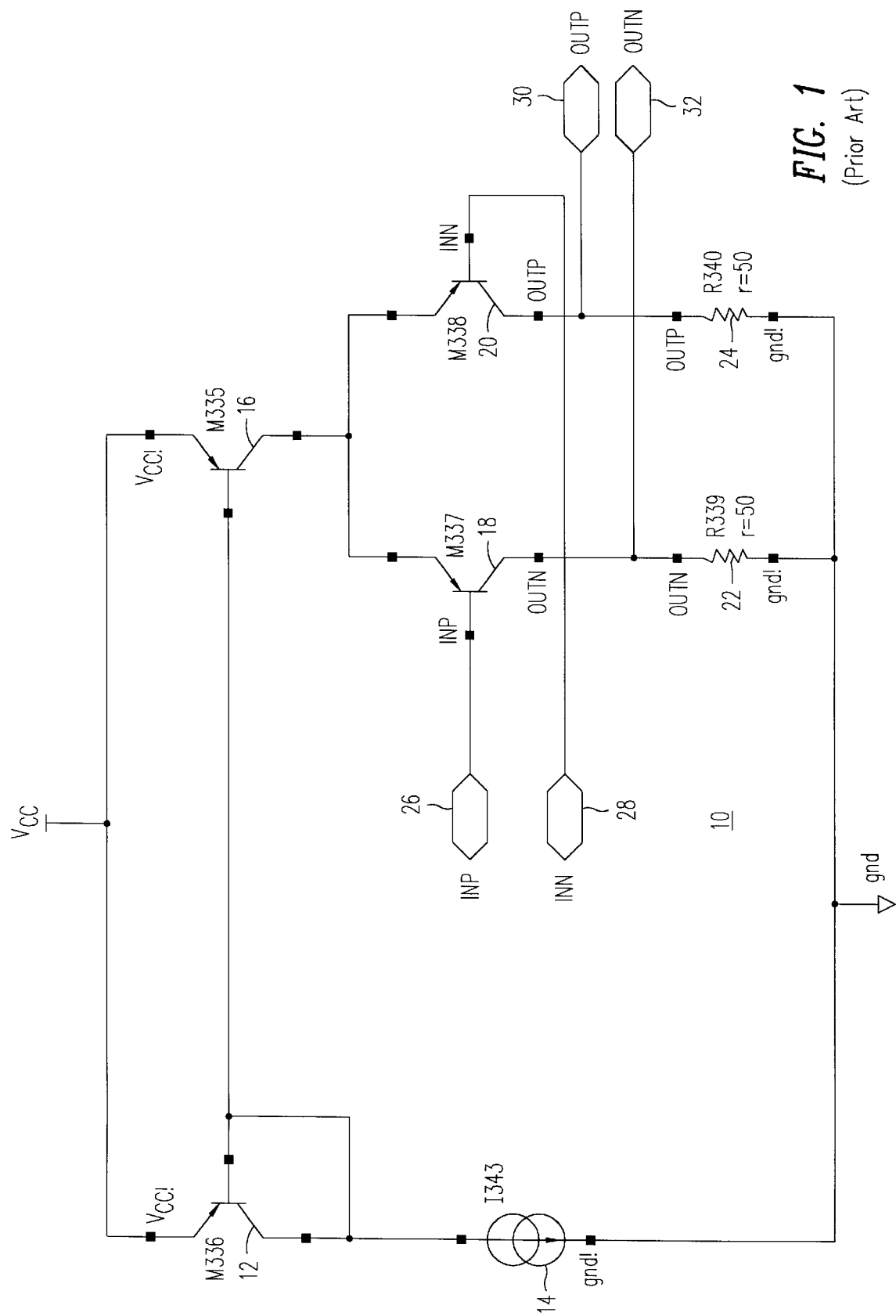
FIG. 1 is a schematic circuit diagram of a current mode driver circuit of the prior art.

As can be seen from the foregoing, apart from transistors 52a and 52b, all of the transistors in the current stage of 60a, 60b, 66a, 66b and the transistors to control the input signals 54a and 54b are all made of NPN transistors. Further, PNP transistors 52a and 52b can be made of slow switching lateral P-type transistors, having one sixteenth the size of the prior art P-type transistor 16, as shown in FIG. 1. Thus, the current capability of each of the P-type transistors 52a and 52b can be much smaller than the transistor 16 of the prior art. Moreover, because the transistors in the current mirror stages 60 and 66 are all vertical N-type and transistors 52a and 52b are all lateral P-type, the manufacturing process to make those transistors is more economical than the manufacturing process to make the high frequency, vertical P-type transistors 18 and 20 shown in FIG. 1 of the prior art.

A further optional circuit 80 can also be added to the current mode driver circuit 50 shown in FIG. 2. The optional circuit 80 is a passive pull down helper circuit 80 which helps to turn off the current mirror 58a or 58b which is not in operation. The optional circuit 80 also comprises all NPN type transistors. A PNP transistor 82 whose emitter is connected to the voltage source Vcc and whose base is connected to the base of PNP transistor 12 provides a biasing current to the optional circuit 80. The collector of the PNP transistor 82 is connected to the base of an NPN transistor 84a. NPN transistor 84a is connected in a cascode manner to NPN transistor 86a. The pair of NPN transistors 84a and 86a are connected between the voltage source Vcc and ground. The junction of the emitter of NPN transistor 84a and collector of NPN transistor 86a is connected to the output of the current stage 60a.

The collector of the PNP transistor 82 is also connected to the base of NPN transistor 84b. NPN transistor 84b and NPN transistor 86b are connected in a cascode manner, between voltage source Vcc and ground. The junction of the emitter of the NPN transistor 84b and collector of transistor 86b is connected to the output terminal of mirror current stage 60b.

The pull down circuit 80 clamps the voltage at 0.6 volts in the down stage and can be replaced by active switches driven by input signals either through DC or AC coupling.

Finally, it should be noted that although the transistors in the current stages 60 and 66 and the transistors 54 are shown as being of NPN type, the present invention can also be implemented using NMOS FET transistors. The advantage of the present invention is that vertical NPN transistors and lateral PNP transistors are easier and less costly to fabricate. Thus, non-state of the art processing and less costly processing methods can be used to obtain a circuit which operates at high speed.

What is claimed is:

1. A current mode driver circuit comprising:

a first transistor means of P-type, having a first terminal, a second terminal, and a third terminal, for controlling the current flow between the first terminal and the second terminal;

a second transistor means of P-type, having a first terminal, a second terminal, and a third terminal, for controlling the current flow between the first terminal and the second terminal; said second P-type transistor means matching in characteristics to said first P-type transistor means;

said first terminal of said first transistor means of P-type and said first terminal of said second transistor means of P-type being commonly connected to a first voltage source;

a first transistor means of N-type, having a first terminal, a second terminal, and a third terminal for controlling the current flow between the first terminal and the second terminal;

a second transistor means of N-type, having a first terminal, a second terminal, and a third terminal for controlling the current flow between the first terminal and the second terminal;

said third terminal of said first and second transistors means of N-type for receiving input signals;

said first terminal of said first and second transistor means of N-type commonly connected to a bias source;

said second terminal of said first and second transistor means of N-type connected to the second terminal of said first and second transistor means of P-type, respectively;

a first current mirror comprising only of transistor means of N-type, having an input terminal, a control terminal, and an output terminal; said input terminal connected to the second terminal of said first transistor means of P-type;

a second current mirror comprising only of transistor means of N-type, having an input terminal, a control terminal, and an output terminal; said input terminal connected to the second terminal of said second transistor means of P-type;

said control terminals of said first and second current mirrors being commonly connected to said first voltage source; and said output terminals of said first and second current mirrors providing output of said current mode driver circuit.

2. The current mode driver of claim 1 wherein each of said first and second current mirrors further comprises:

a plurality of serially connected current stages, each stage having an input terminal a control terminal, and an output terminal; with said output terminal of one stage connected to the input terminal of another stage; and said control terminals of said plurality of current stages commonly connected to said first voltage source.

3. The current mode driver of claim 2, wherein each current stage further comprises:

a second transistor means of N-type having a first terminal, a second terminal and a third terminal for controlling the current flow between the first terminal and the second terminal;

a third transistor means of N-type having a first terminal, a second terminal and a third terminal for controlling the current flow between the first terminal and the second terminal;

said input terminal connected to said first and third terminals of said second transistor means of N-type and to said third terminal of said third transistor means of N-type;

said control terminal connected to said first terminal of said third transistor means of N-type; and said output terminal connected to said second terminals of said second and third transistor means of N-type.

4. The current mode driver of claim 2 further comprising:

a pull down circuit having a first connection to said first voltage source, and a second connection to an output terminal of one of said current stages in each of said first and second current mirrors.

5. The current mode driver of claim 4 wherein said pull down circuit further comprises:

N-type transistor means for receiving a current from said first voltage source and for switching off current flow in each of said first and second current mirrors.

* * * * *